United States Patent [19]
Landis

[11] Patent Number: 4,739,446
[45] Date of Patent: Apr. 19, 1988

[54] HEADER FOR A WAFER SCALE ASSEMBLY

[75] Inventor: Richard C. Landis, Shelton, Conn.

[73] Assignee: ITT Defense Communications, a division of ITT Corporation, Nutley, N.J.

[21] Appl. No.: 860,168

[22] Filed: May 5, 1986

[51] Int. Cl.⁴ .............................................. H05K 7/20
[52] U.S. Cl. ..................................... 361/385; 357/82; 361/414; 439/485
[58] Field of Search .............. 174/16 HS; 339/112 L, 339/17 CF, 176 MP; 357/81, 82; 361/386–389, 392–395, 405, 413, 417–420

[56] References Cited
U.S. PATENT DOCUMENTS

| | | | |
|---|---|---|---|
| 3,323,023 | 5/1967 | Walker | 361/393 |
| 4,033,656 | 7/1977 | Freehauf et al. | 339/17 CF |
| 4,092,697 | 5/1978 | Spaight | 361/387 |
| 4,315,300 | 2/1982 | Parmerlee et al. | 361/384 |
| 4,432,038 | 2/1984 | Bell | 361/386 |
| 4,491,376 | 1/1985 | Gladd et al. | 339/176 MP |

*Primary Examiner*—A. D. Pellinen
*Assistant Examiner*—Gregory D. Thompson
*Attorney, Agent, or Firm*—Robert A. Walsh; Thomas N. Twomey; Mary C. Werner

[57] ABSTRACT

A header for a wafer scale assembly includes a plurality of pins having end portions connectable to the wafer scale assembly. The end portions lie in a single plane that it substantially parallel to the plane of the wafer scale assembly.

10 Claims, 4 Drawing Sheets

HEADER FOR A WAFER SCALE ASSEMBLY

CROSS-REFERENCE TO RELATED APPLICATIONS

This application is related to one, or more, of the following U.S. patent applications: Ser. No. 859,964, entitled PACKAGE FOR A SEMICONDUCTOR ASSEMBLY; Ser. No. 859,962, entitled JUMPER FOR A SEMICONDUCTOR ASSEMBLY; Ser. No. 859,942, entitled MULTILAYER CONNECTION FOR A SEMICONDUCTOR CHIP; Ser. No. 859,961, entitled SEMICONDUCTOR INTEGRATED DEVICE HAVING REDUNDANT TERMINALS FOR DISCRETE ELECTRICAL CONDUCTORS; Ser. No. 859,963, entitled MULTIPLE WAFER SCALE ASSEMBLY APPARATUS AND FIXTURE FOR USE DURING THE FABRICATION THEREOF; Ser. No. 859,940, entitled A DIRECT INTERCONNECTION FOR USE BETWEEN A SEMICONDUCTOR AND A PIN CONNECTION OR THE LIKE; Ser. No. 859,938, entitled INITERLAYER CONDUCTIVE CONNECTIONS AND METHOD FOR FORMING SAME and Ser. No. 860,151, entitled UNIVERSAL WAFER SCALE ASSEMBLY all filed on even date herewith and assigned to the assignee hereof.

BACKGROUND OF THE INVENTION

The present invention generally relates to a header for a wafer scale assembly and, in particular, relates to such a header having a plurality of pins disposed such that the end portions thereof to be connected to the wafer scale assembly lie in a plane substantially parallel to a plane of the wafer scale assembly.

In general, a wafer scale assembly is an electronic device that includes a substrate, usually silicon, having a plurality of active semiconductor chips affixed to one surface thereof. The substrate usually includes conductive paths for interconnecting the active semiconductor chips affixed thereto. This type of assembly allows many active chips to be interconnected into a single operative device in a reliable fashion. Such an assembly is considerably more reliable than a functionally identical element wherein the devices are formed in a semiconductor substrate by semiconductor integrated circuit fabrication techniques. One reason for the increased reliability is that the individual chips can be tested prior to affixing them to the substrate to ensure that each is operable.

Such wafer scale assembly devices have numerous advantages in addition to the reliablity thereof. For example, wafer scale assemblies generally have an excellent thermal matching between the substrate chips affixed thereto and consequently, thermally related expansions and contractions are less destructive. Further, the wafer scale assemblies offer high chip density arrangements similar to that of wafer sized integrated devices. In addition, wafer scale assemblies including both the substrate and the individual chips can each be made by conventional integrated circuit fabrication processes thereby providing a relatively low cost per function as well as the ability to mix different integrated circuit technologies on the same substrate, such as, for example, MOS and BIPOLAR device chips can be mounted on the same silicon substrate.

However, conventional wafer scale assemblies do have a drawback, to wit, as part of the packaging procedure, the silicon substrate of the wafer scale assembly is bonded to a ceramic substrate and the connections from the silicon substrate are wire-bonded to bonding pads along the periphery of the ceramic substrate. The ceramic substrate includes a plurality of pins that extend through the ceramic material to contact the bonding pads. These pins then extend substantially perpendicular to the major surface of the ceramic substrate opposite the bonding surface of the silicon substrate. The overall ceramic substrate is then hermetically sealed either by use of a cover or by a non-conductive sealant epoxy. Such a pin arrangement weakens the ceramic substrate and increases the potential for fracture thereof. Any fracture of the ceramic substrate renders the entire wafer assembly useless as an entity and consequently, that entire package must be replaced.

Consequently, a header for use with a wafer scale assembly that avoids through-holes in a brittle material is quite desireable to avoid the potential fracturing of the wafer scale assembly.

SUMMARY OF THE INVENTION

Accordingly, it is one object of the present invention to provide a wafer scale assembly header that is arranged so that all connections to the wafer scale assembly are made without the use of through-holes in either the wafer scale assembly, per se, or the header.

This object is accomplished, at least in part, by a header for a wafer scale assembly that includes a plurality of pins disposed such that the end portions thereof to be connected to the wafer scale assembly lie in a plane that is substantially parallel to the plane of the wafer scale assembly.

Other objects and advantages will become apparent to those skilled in the art from the following detailed description read in conjunction with the appended claims and the drawings attached hereto.

DETAILED DESCRIPTION OF THE INVENTION

Figure 5:
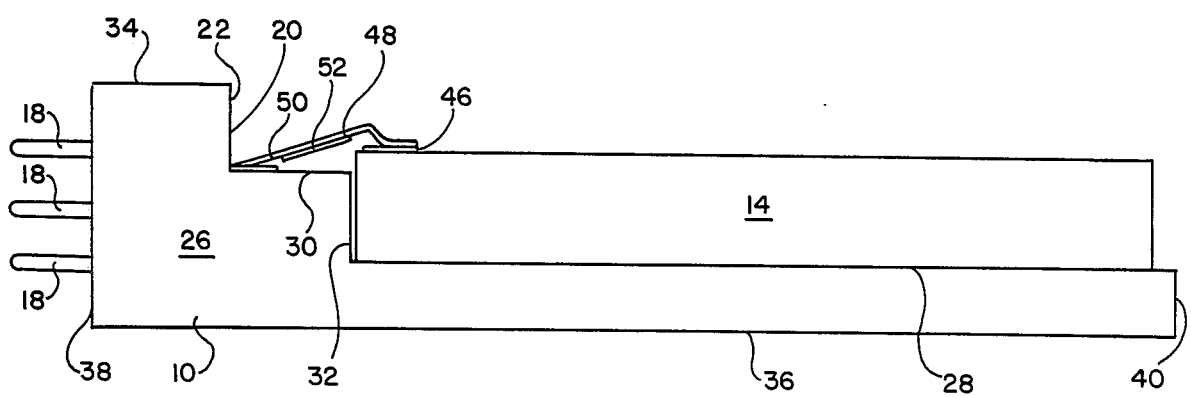
FIG. 5 is a perspective view, not drawn to scale, of a header embodying the principles of the present invention having a wafer scale assembly mounted thereon.
Figure 6:
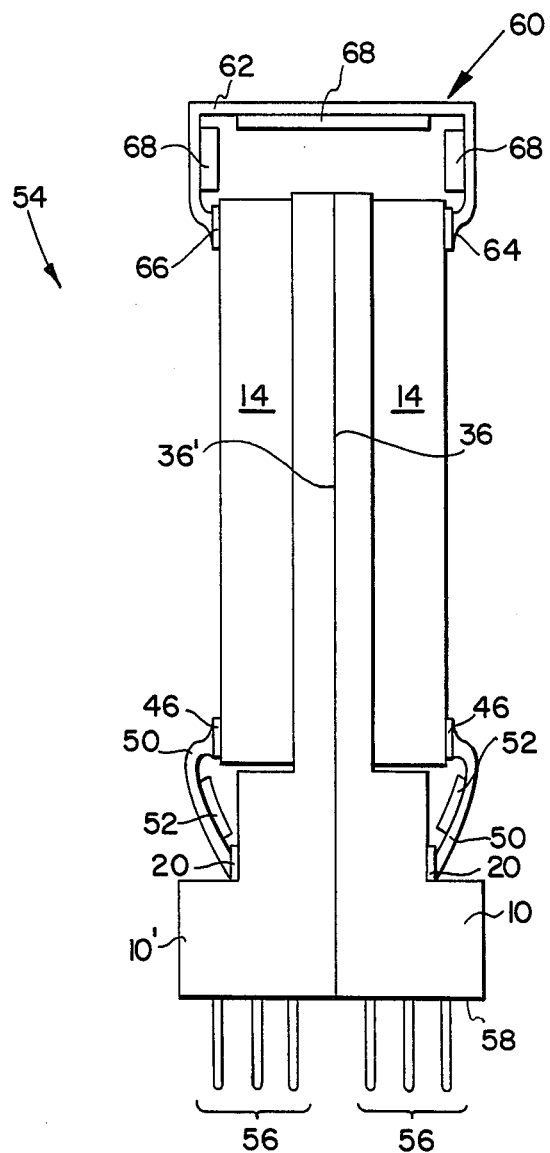
FIG. 6 is a perspective view, not drawn to scale, of a back-to-back header arrangement embodying the principles of the present invention.

A header, generally indicated at 10 in the Figures and embodying the principles of the present invention, includes means 12 for receiving a semiconductor wafer scale assembly 14, shown in FIGS. 5 and 6, and means 16 for retaining a plurality of electrically conductive pins 18. Preferably, the pins 18 each have a first end portion 20 extending from one surface 22 of the means 16 and lying in a single plane. The header 10, in the preferred embodiment, further includes means 24 for supporting the first end portions 20 of the pins 18.

In one preferred embodiment, the header 10 includes a unitary member 26 having the electrically conductive pins 18 pre-positioned and secured therewithin. The member 26, preferably, defines the means 12 for receiving the semiconductor wafer scale assembly 14 and the means 24 for supporting the first end portions 18 of the electrically conductive pins 18. Preferably, the means 12 is defined by a first planar surface 28 and the means 24 for supporting the first end portions 18 of the pins 18 is defined by a second planar surface 30. The first and second planar surfaces, 28 and 30, respectively, are preferably spaced apart and lie in substantially parallel planes. The member 26 further includes a first shoulder surface 32 extending between the first and second planar surfaces, 28 and 30. Preferably, the first shoulder surface 32 lies in a plane substantially perpendicular to the parallel planes of the first and second planar surfaces, 28 and 30, respectively.

The unitary member 26 further includes a third planar surface 34 that, preferably, lies in a plane parallel to the plane of the second planar surface 30 and has one edge 35 thereof defined by the one surface 22 extending between the third planar surface 34 and the second planar surface 30. Thus, the second planar surface 30, in this embodiment, laterally extends between from the one surface 22 to the shoulder surface 32. Preferably, the one surface 22 lies in a plane substantially perpendicular to the planes of the second and third planar surfaces, 30 and 34, respectively. In addition, the unitary member 26 includes a fourth planar surface 36 spaced apart from and lying in a plane parallel to the planes of first, second and third planar surfaces, 28, 30 and 34, respectively. A first end surface 38 and a second end surface 40 extend from the fourth planar surface 36 to the third planar surface 34 and the first planar surface 28, respectively. Preferably, each of the pins 18 includes a second end portion 42 extending from the first end surface 38 of the member 26.

Figure 2:
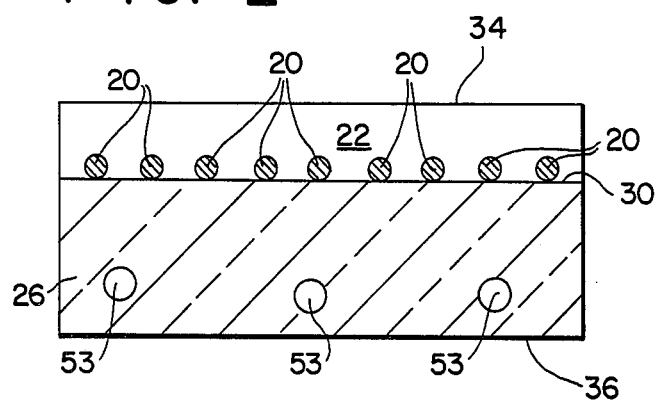
FIG. 2 is a cross-sectional view, not drawn to scale, of the header of FIG. 1 taken along the line 2—2 thereof.

In the preferred embodiment, the first end portions 20 of the pins 18 lie in a single plane. As shown more clearly in FIG. 2 that is a cross-sectional view taken along the plane of the one surface 22. The first end portions 20 of the pins 18 are adapted to be connected directly to the wafer scale assembly 14. Further, the first end portions 20 of the pins 18, preferably, extend over and are supported by the second planar surface 30.

Figure 1:
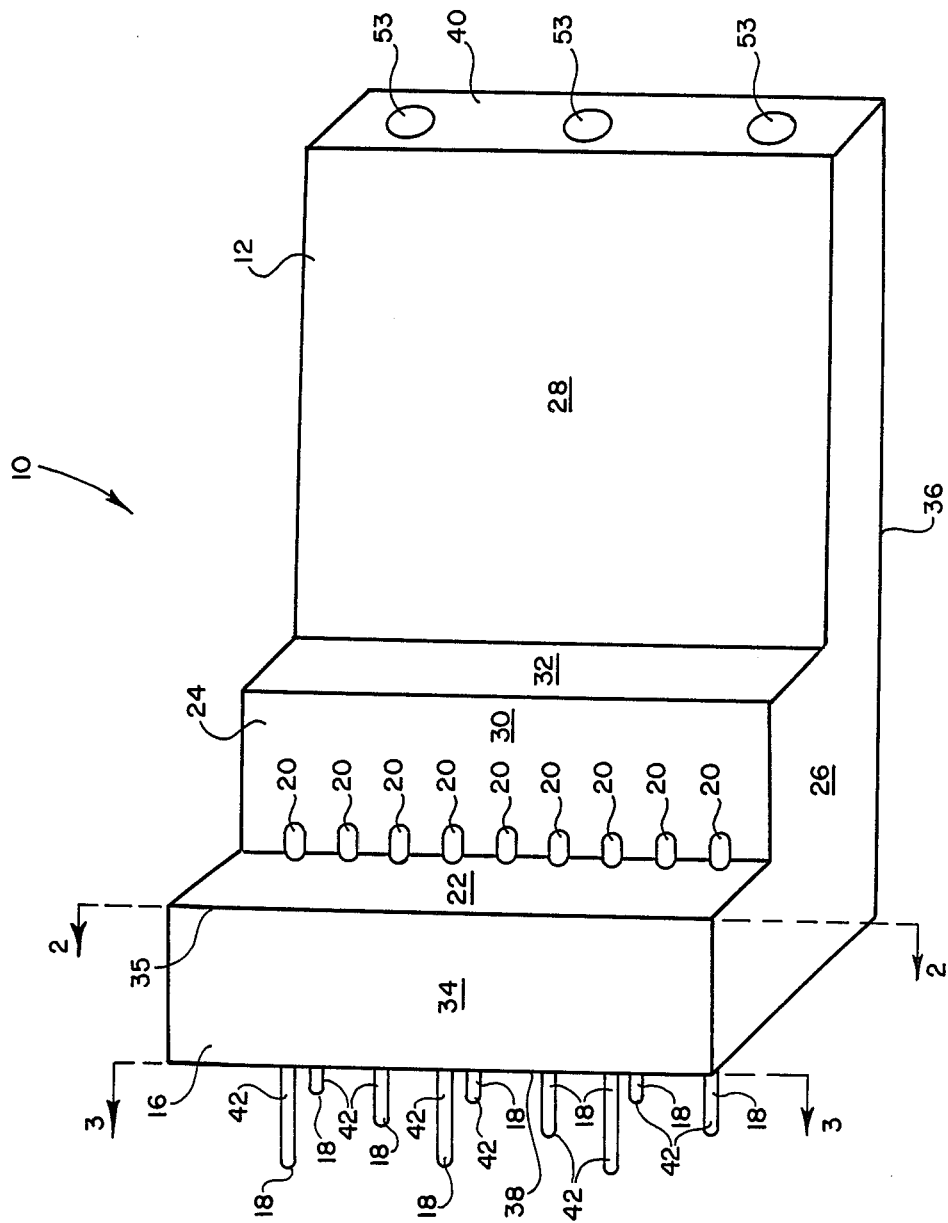
FIG. 1 is a perspective view, not drawn to scale, of a header embodying the principles of the present invention, for a wafer scale assembly.
Figure 3:
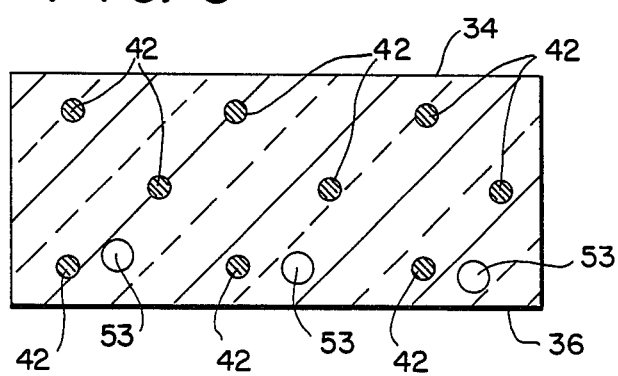
FIG. 3 is a cross-sectional view, not drawn to scale, of the header of FIG. 1 taken along the line 3—3 thereof.

In addition, as shown in the cross-sectional view of FIG. 3 as taken along the line 3—3 of FIG. 1, the second end portions 42 of the pins 18 protrude from the first end surface 38 in a staggered grid array. In particular, the second end portions 42 are fanned-out to allow the header 10 to be more readily adaptable to be plugged into a corresponding socket, not shown in the drawings.

Figure 4:
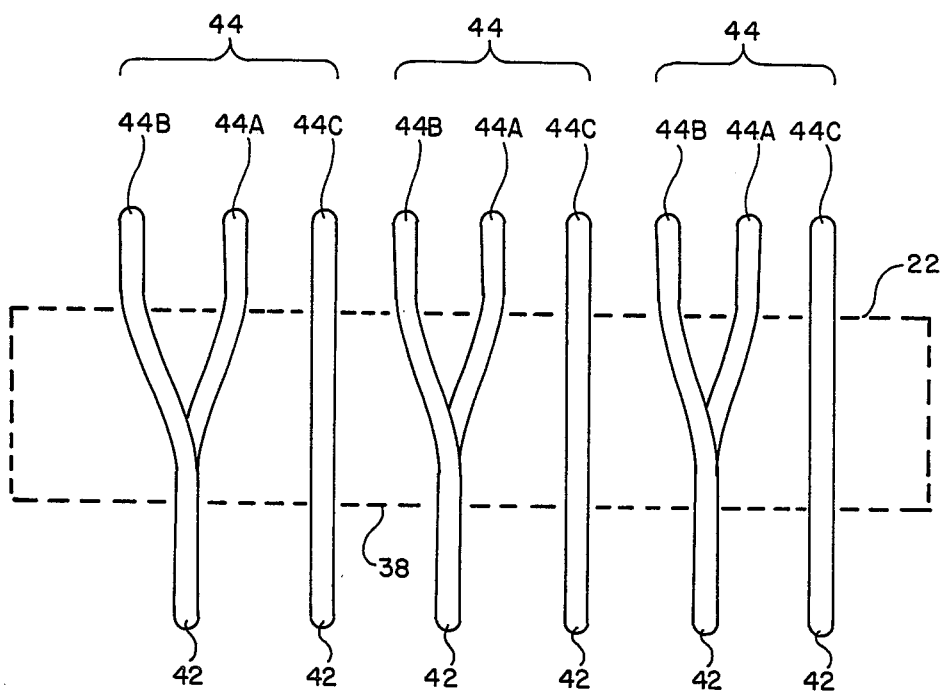
FIG. 4 is a plan view, not drawn to scale, of the pin path through the header shown in FIG. 1.

The routing of the pins 18 internal to the unitary member 26 is shown more clearly in FIG. 4. The internal routing is preferably repeated for each three-pin grouping 44 although any other convenient routing can also be used. In the preferred routing, the center pin 44A of each of the three-pin groupings 44 and one of the pins 44B adjacent thereto are each routed, via a compound curve, such that they are vertically aligned upon protruding from the first end surface 38. The third pin 44C of the three-pin grouping 44 then curves within a single plane and, preferably protrudes from the first edge surface 38 of the member 26 at a height, with respect to the fourth planar surface 36, intermediate the other two pins, 44A and 44B. It will be understood that the curve of the third pins 44C is undetected in FIG. 4 since the curve lies in a plane perpendicular to the paper. In this fashion the header 10 thus provides a single planar array of first end portions 20 to be bonded to appropriate connections, usually bond pads 46, shown in FIGS. 5 and 6, on the wafer scale assembly 14 but, nevertheless, provides a staggered array through the member 26 for ease in manufacturing and actual operational plugging-in.

A profile view of one preferred embodiment of the header 10 having a semiconductor wafer scale assembly 14 mounted thereon and including a direct interconnection 48 is shown is FIG. 5. As shown therein, the wafer scale assembly 14 is mounted, via epoxy bonding or other technique known in the art, to the first planar surface 28 and electrically connected to the first end portion 20 of the pins 18 via the direct interconnection 48. Preferably, the direct interconnect 48 includes a plurality of electrically conductive strips 50 having a dielectric member 52 underlying a portion thereof. Each conductive strip 50 extends beyond the dielectric member 52 to allow thermal compression bonding to the first end portion 20 of the pins 18 and to the bond pads 46 of the wafer scale assembly 14. One direct interconnect 48 particularly useful for connecting the first end portions 20 of the pins 18 to the bond pins 46 of the wafer scale assembly 14 is more fully described and discussed in U.S. patent application Ser. No. 859,940, entitled A DIRECT INTERCONNECTION FOR USE BETWEEN A SEMICONDUCTOR AND A PIN CONNECTION OR THE LIKE filed on even date herewith and assigned to the assignee hereof. This application is incorporated herein by reference.

In the preferred embodiment, the header 10 is formed by known plastic molding techniques. Alternatively, the header 10 can be formed from a ceramic material. However, in instances where the heat dissipation is not a factor or where the heat is dissipated via the active surface of the wafer scale assembly 14, the less expensive plastic molded header 10 is preferred.

The physical dimensions of the header 10 can be adapted to conform and be compatible for almost any sized wafer scale assembly 14. Generally, however, a present wafer scale assembly is about 8 cm by 10 cm and has a thickness of about 0.05 cm. Further, the pins 18 will typically have an outside diameter of about 0.25 millimeters and spaced on about 0.42 millimeter centers. As a result, if the bond pads 46 extend about 0.25 millimeters from the surface of the wafer scale assembly 14, the first shoulder 32 should have a height on the order of about 0.4 millimeters. This ensures that the first end portions 20 of the pins 18 will lie in a plane that is substantially coplanar with the plane of the bond pads 46.

One particular arrangement that is particularly useful for cooling the molded pin header 10 is shown and described in U.S. patent application Ser. No. 859,964 filed on even date herewith entitled PACKAGE FOR A SEMICONDUCTOR ASSEMBLY. The above-identified application is assigned to the assignee hereof and incorporated herein by reference. As discussed therein, a wafer scale assembly is mounted within an enclosed volume having, in operation, a fluid coolant flowing therethrough. The flowing coolant allows heat dissipation from the wafer scale assembly to occur at the active surfaces of the semiconductor chips thereof rather than through the substrate.

Alternatively, to enhance the cooling of the wafer scale assembly 14 the first planar surface 28 can be cooled by flowing a coolant through one, or more openings 53 provided through the unitary member 26. The number and size of the openings 53 can vary, of course, according to the thermal energy to be removed.

An additional advantage of the present header 10 is that the fourth planar surface 36 can, when heat dissipation is not a factor, be mounted back-to-back with another similar header 10' to form a more functional device.

In one particular assembly, generally indicated at 54 in FIG. 6, the individual headers 10 and 10' are affixed to each other at the fourth planar surfaces, 36 and 36', respectively, thereof, for example, by use of an epoxy. One advantage of such an assembly 54 is that pairs of such wafer scale assemblies 14 can be interconnected for increased functionality but nevertheless, have the external pin portions 56 extending from a common planar surface 58. In addition, the wafer scale assemblies 14 so mounted can be interconnected to provide a integrated double wafer scale assembly electronic element.

One particular apparatus for such an interconnection, is indicated at 60 in FIG. 6, provides an inverted U-shaped tape-lead conductor having strips of electrically conductive material 62 extending from one plurality of bonding pads 64 on one of the wafer scale assembly 14 to a corresponding plurality of bond pads 66 on the second wafer scale assembly 14. The electrically conductive strips 62 are provided and formed from an underlying dielectric material 68 that provides support for the electrically conductive strips 62. One such interconnection 60 is more fully described and discussed in U.S. patent application Ser. No. 859,962 filed on even date herewith and entitled JUMPER FOR A SEMICONDUCTOR ASSEMBLY. This application is assigned to the assignee hereof and incorporated herein by reference.

One particular advantage of the header 10 is that the end portions 20 of the electrically conductive pins 18 directly connected to the bond pads 46 of a wafer scale assembly 14 connected lie in a plane substantially parallel to the plane of the bond pads 46. This arrangement substantially completely avoids the through-holes currently used for conventional wafer scale assemblies. Hence, the stability and long term life of the wafer scale assembly is improved.

Although the present invention has been described herein with respect to specific embodiments, it will be understood that other arrangements and configurations may be also be developed that, nevertheless, do not depart from the spirit and scope of the present invention. Hence, the present invention is deemed limited only by the appended claims and the reasonable interpretation thereof.

What is claimed is:

1. A header for a semiconductor assembly, said header comprises:
   means for receiving the semiconductor assembly, said receiving means including a first planar surface;
   a plurality of electrically conductive pins, each of said pins having a first end portion;
   means for retaining said pins in a single plane substantially parallel to the plane of said first planar surface; and
   a second planar surface, said second planar surface being substantilly parallel with said first planar surface and substantially perpendicularly displaced from said first planar surface such that said first end portions of said pins are substantially coplanar with connecting pads of the semiconductor assembly when the semiconductor assembly is affixed to said first planar surface, said second planar surface underlying and supporting said first end portions.

2. A header as claimed in claim 1 further comprising:
   a first shoulder surface, said first shoulder surface extending between said first and second planar surfaces.

3. A header as claimed in claim 2 wherein said first shoulder surface lies in a plane substantially perpendicular to the plane of said first planar surface.

4. A header as claimed in claim 1 wherein said pin retaining means includes:
   a first surface, said first surface having said first end portions of said pins extending therefrom; and
   a first end surface, said first end surface being substantially perpendicular to said second planar surface and spaced apart from said first surface whereby second end portions of said pins extend therefrom.

5. A header as claimed in claim 4 further comprising:
   a third planar surface, said third planar surface extending between said first surface and said first end surface.

6. A header as claimed in claim 5 further comprising:
   a fourth planar surface, said fourth planar surface being spaced apart from said first, second and third planar surfaces and defined by said first end surface and a second end surface, said second end surface extending from said fourth planar surface and said first planar surface.

7. A header as claimed in claim 1 wherein said header is defined by a unitary molded member.

8. A header as claimed in claim 1 further comprising:
   means for accommodating the flow of a coolant through said header.

9. A header as claimed in claim 8 wherein said coolant flow accomodation means includes:
   one or more openings, said openings extending proximate said receiving means whereby when a coolant is flowed therethrough heat dissipation from said receiving means is increased.

10. A header for a semiconductor assembly, said header comprises:
   means for receiving the semiconductor assembly, said receiving means including a first planar surface;
   a plurality of electrically conductive pins, each of said pins having a first end portion;
   means for retaining said pins, in a single plane substantially parallel to the plane of said first planar surface, said pin retaining means further including a first surface, said first surface having said first end portions extending therefrom and a first end surface, said first end surface being substantially perpendicular and spaced apart from said first planar surface whereby second end portions of said pins extend therefrom in a multi-row array; and
   a second planar surface, said second planar surface being substantially parallel with said first planar surface and substantially perpendicularly displaced from said first planar surface such that said first end portions of said pins are substantially coplanar with connecting pads of the semiconductor assembly when the semiconductor assembly is affixed to said first planar surface, said second planar surface underlying and supporting said first end portions.

* * * * *